(12) United States Patent
Yang et al.

(10) Patent No.: US 8,728,895 B1
(45) Date of Patent: May 20, 2014

(54) DOUBLE DIFFUSED METAL OXIDE SEMICONDUCTOR DEVICE AND MANUFACTURING METHOD THEREOF

(71) Applicants: Ching-Yao Yang, Changhua (TW); Tsung-Yi Huang, Hsinchu (TW); Huan-Ping Chu, HsinChu (TW); Hung-Der Su, Pingzhen (TW)

(72) Inventors: Ching-Yao Yang, Changhua (TW); Tsung-Yi Huang, Hsinchu (TW); Huan-Ping Chu, HsinChu (TW); Hung-Der Su, Pingzhen (TW)

(73) Assignee: Richtek Corporation Technology R.O.C., Chupei, Hsin-Chu (TW)

( * ) Notice: Subject to any disclaimer, the term of this patent is extended or adjusted under 35 U.S.C. 154(b) by 0 days.

(21) Appl. No.: 14/146,528

(22) Filed: Jan. 2, 2014

Related U.S. Application Data

(62) Division of application No. 13/066,622, filed on Apr. 20, 2011.

(51) Int. Cl.
*H01L 21/336* (2006.01)

(52) U.S. Cl.
USPC .................... 438/294; 438/279; 257/336

(58) Field of Classification Search
USPC .................... 438/279, 294; 257/336
See application file for complete search history.

*Primary Examiner* — Marvin Payen
(74) *Attorney, Agent, or Firm* — Tung & Associates (57) ABSTRACT

The present invention discloses a double diffused metal oxide semiconductor (DMOS) device and a manufacturing method thereof. The DMOS device includes: an isolation structure for defining device regions; a gate with a ring-shaped structure; a drain located outside the ring; and a lightly doped drain, a source, and a body electrode located inside the ring. To increase the sub-threshold voltage at the corners of the gate, the corners are located completely on the isolation structure, or the lightly doped drain is apart from the corners by a predetermined distance.

3 Claims, 10 Drawing Sheets

DOUBLE DIFFUSED METAL OXIDE SEMICONDUCTOR DEVICE AND MANUFACTURING METHOD THEREOF

CROSS REFERENCE

The present invention claims priority to TW 100102809, filed on Jan. 26, 2011.

This is a Divisional of a co-pending application Ser. No. 13/066,622, filed on Apr. 20, 2011.

BACKGROUND OF THE INVENTION

1. Field of Invention

The present invention relates to a double diffused metal oxide semiconductor (DMOS) device and a method of manufacturing the DMOS device; particularly, it relates to a DMOS device which has a gate having a ring-shaped structure, and a method of manufacturing the DMOS device.

2. Description of Related Art

Figure 1A:
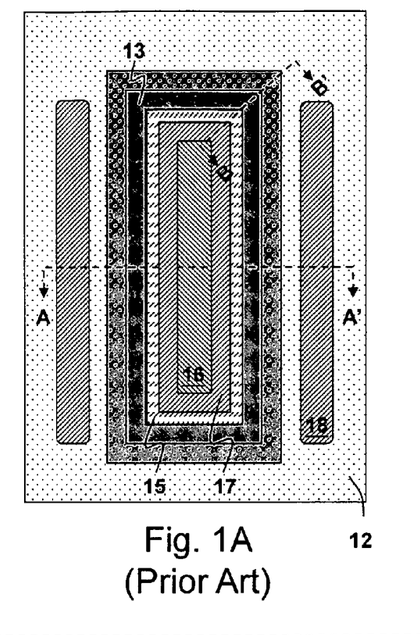
FIGS. 1A-1C show a top view and two cross-section views of a conventional DMOS device, respectively.
Figure 1B:
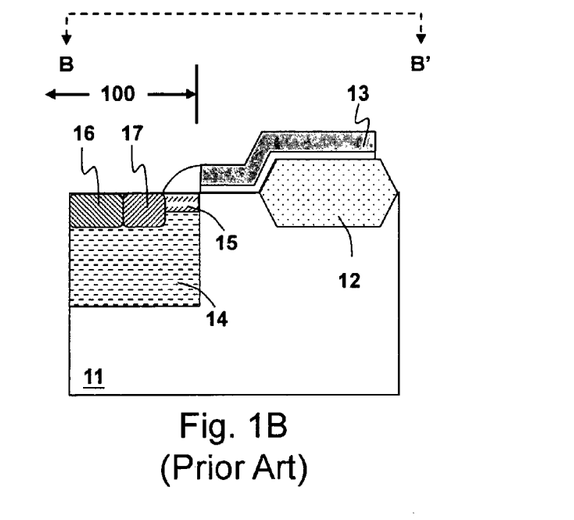
Figure 1C:
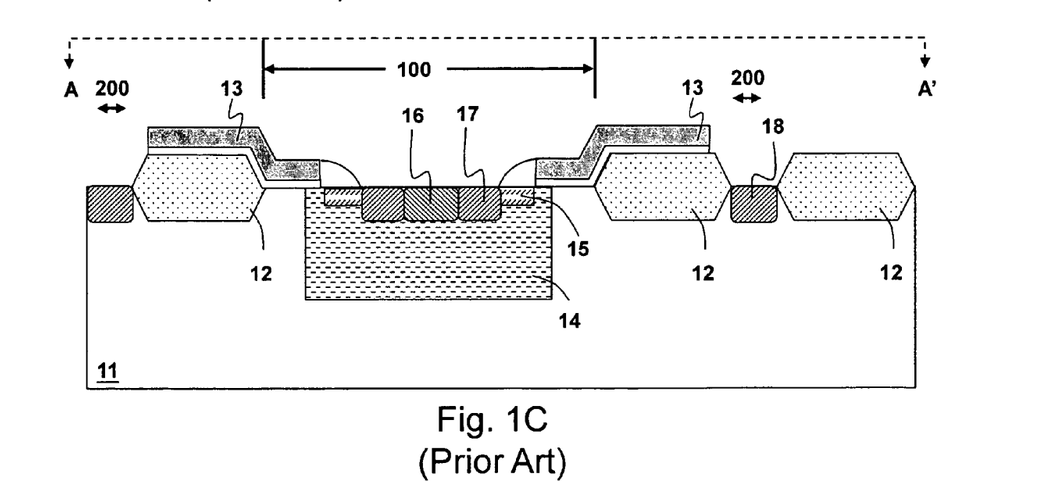
Figure 2A:
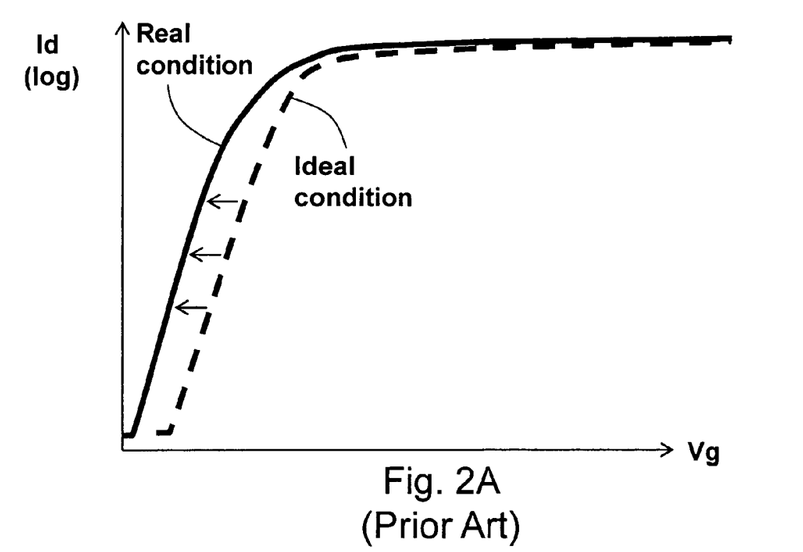
FIG. 2A shows a characteristic curve illustrating the relationship between drain current and gate voltage of the conventional DMOS device.
Figure 2B:
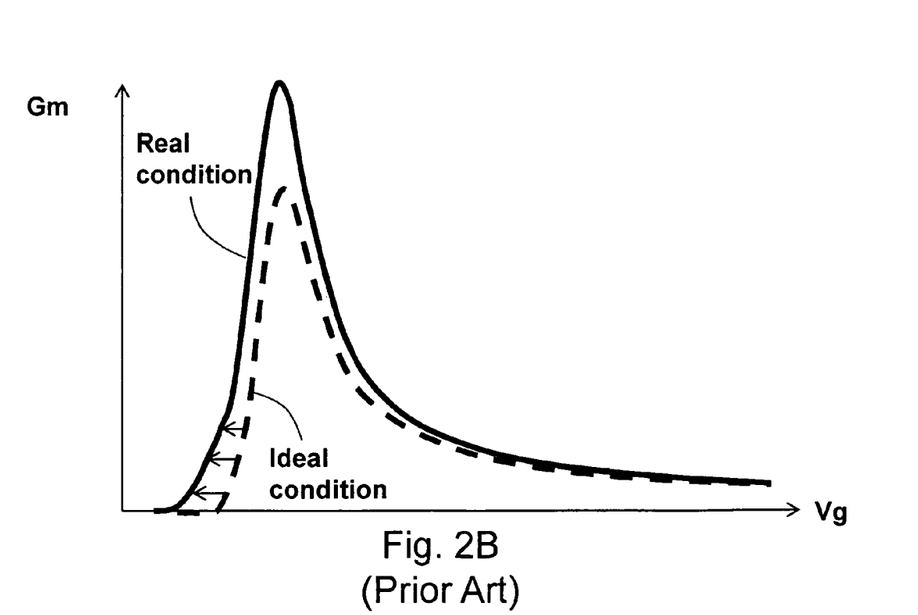
FIG. 2B shows a characteristic curve illustrating the relationship between drain conductance and gate voltage of the conventional DMOS device.

FIGS. 1A-1C show a top view and two cross-section views of a conventional DMOS device, respectively. Referring to FIGS. 1A-1C, an isolation structure 12 (including multiple cross-sectional regions from cross-section views) is formed in a P-type silicon substrate 11 to define a first device region 100 and a second device region 200. The isolation structure 12 for example is formed by local oxidation of silicon (LOCOS). A gate 13 having a ring-shaped structure is formed on the substrate 11. A body region 14, a lightly doped drain 15, a body electrode 16, and a source 17 are formed in the first device region 100, and a drain 18 is formed in the second device region 200. In normal operation of the DMOS device, a channel is formed between the source 17 and the drain 18. However, at the edges of the channel, in particular around the corners of the ring-shaped structure of the gate 13, the body region has a relatively lower concentration of the P-type impurities, and thus the impurities are diffused to a relatively smaller distance; in contrast, the lightly doped drain 15 which is doped with the N-type impurities has about similar concentrations at the corners of the ring-shaped structure and in the middle of the channel. Therefore, when the DMOS device operates, the resistance around the corners of the ring-shaped structure of the gate 13 is relatively lower, such that the characteristics of the DMOS device are adversely impacted as shown in FIGS. 2A and 2B. FIG. 2A shows the relationship between the gate voltage Vg and the drain current Id in logarithmic scale. FIG. 2B shows the relationship between the gate voltage Vg and the drain conductance gm. From FIGS. 2A and 2B, it can be seen that due to the relatively lower resistance around the corners of the ring-shaped structure, in real condition, the DMOS device will turn ON at relatively lower gate voltage Vg as indicated by the solid line, as compared to the ideal condition indicated by the dash line. That is, the performance of the DMOS device is deteriorated in the real condition by the aforementioned corner effect.

More specifically, FIG. 1C is a cross-section view taken along the cross-section line AA' in FIG. 1A, which shows the middle of the channel; and FIG. 1B is a cross-section view taken along the cross-section line BB' in FIG. 1A, which shows the edge of the channel. As shown in FIG. 1B by the distance between the body region 14 and the gate 13, because the body region 14 has a relatively lower concentration around the corners of the ring-shaped structure, the impurities are diffused to a relatively smaller distance. In contrast, as shown in FIG. 1C by the distance between the body region 14 and the gate 13, the impurities concentration in the middle of the channel are relatively higher, and the body region 14 is diffused to a larger distance. The relative locations of the body region 14 and the gate 13 in FIGS. 1B and 1C indicate that the N-type impurities of the lightly doped drain 15 are less counter-doped by P-type impurities in FIG. 1B (at the edges of the channel, in particular around the corners of the ring-shaped structure) than in FIG. 1C (middle of the channel). Hence, the resistance around the corners of the ring-shaped structure is relatively lower and the sub-threshold voltage there is also relatively lower. In consequence, the DMOS device will turn ON at a relatively lower voltage as shown in FIGS. 2A and 2B, i.e., the threshold voltage of the DMOS device is reduced.

In view of the foregoing, the present invention provides a DMOS device and a method of manufacturing the DMOS device, to improve the drawback that the DMOS device turns ON at a lower threshold voltage, and to increase the threshold voltage of the DMOS device; the present invention improves the parameters of the devices at the corners of the ring-shaped structure, such that the DMOS device has a better performance.

SUMMARY OF THE INVENTION

The objectives of the present invention are to provide a DMOS device and a method of manufacturing the DMOS device.

To achieve the objectives mentioned above, from one perspective, the present invention provides a DMOS device, comprising: a substrate in which an isolation structure is formed for defining a first device region and a second device region; a gate which is formed on the substrate and has a ring-shaped structure located along a boundary of the first device region, wherein the ring-shaped structure is completely or partially inside the first device region from top view; a body region doped with first conductive type impurities, which is formed in the first device region in an area defined by the ring-shaped structure; a lightly doped drain doped with second conductive type impurities, which is formed in the body region; a source doped with the second conductive type impurities, which is formed in the body region, interior of the lightly doped drain; a body electrode doped with the first conductive type impurities, which is formed in the body region, interior of the source; and a drain which is formed in the second device region; wherein corners of the ring-shaped structure are located completely on the isolation structure.

In a preferred embodiment, the ring-shaped structure is substantially rectangular and both the shorter sides of the ring-shaped structure are located completely on the isolation structure.

From another perspective, the present invention provides a DMOS device, comprising: a substrate in which an isolation structure is formed for defining a first device region and a second device region; a gate which is formed on the substrate and has a ring-shaped structure located along a boundary of the first device region, wherein the ring-shaped structure is completely or partially inside the first device region from top view; a body region doped with first conductive type impurities, which is formed in the first device region in an area defined by the ring-shaped structure; a lightly doped drain doped with second conductive type impurities, which is formed in the body region; a source doped with the second conductive type impurities, which is formed in the body region, interior of the lightly doped drain; a body electrode doped with the first conductive type impurities, which is formed in the body region, interior of the source; and a drain which is formed in the second device region; wherein the lightly doped drain is apart from corners of the ring-shaped structure by a predetermined distance.

In a preferred embodiment, the predetermined distance is not less than either a design rule critical dimension or 1 µm.

From another perspective, the present invention provides a method of manufacturing a DMOS device, comprising: providing a substrate in which an isolation structure is formed for defining a first device region and a second device region; forming a gate on the substrate, the gate having a ring-shaped structure located along a boundary of the first device region, wherein the ring-shaped structure is completely or partially inside the first device region from top view; forming a body region in the first device region in an area defined by the ring-shaped structure, the body region being doped with first conductive type impurities; forming a lightly doped drain in the body region, the lightly doped drain being doped with second conductive type impurities; forming a source in the body region, interior of the lightly doped drain, the source being doped with the second conductive type impurities; forming a body electrode in the body region, interior of the source, the body electrode being doped with the first conductive type impurities; and forming a drain in the second device region; wherein corners of the ring-shaped structure are located completely on the isolation structure.

From another perspective, the present invention provides a method of manufacturing a DMOS device, comprising: providing a substrate in which an isolation structure is formed for defining a first device region and a second device region; forming a gate on the substrate, the gate having a ring-shaped structure located along a boundary of the first device region, wherein the ring-shaped structure is completely or partially inside the first device region from top view; forming a body region in the first device region in an area defined by the ring-shaped structure, the body region being doped with first conductive type impurities; forming a lightly doped drain in the body region, the lightly doped drain being doped with second conductive type impurities; forming a source in the body region, interior of the lightly doped drain, the source being doped with the second conductive type impurities; forming a body electrode in the body region, interior of the source, the body electrode being doped with the first conductive type impurities; and forming a drain in the second device region; wherein the lightly doped drain is apart from corners of the ring-shaped structure by a predetermined distance.

In a preferred embodiment, the DMOS device includes two lateral double diffused metal oxide semiconductor (LDMOS) devices with a common source, or two double diffused drain metal oxide semiconductor (DDDMOS) devices with a common source.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the process steps and the interrelationship between the layers/parts, but not drawn according to actual scale.

Figure 3A:
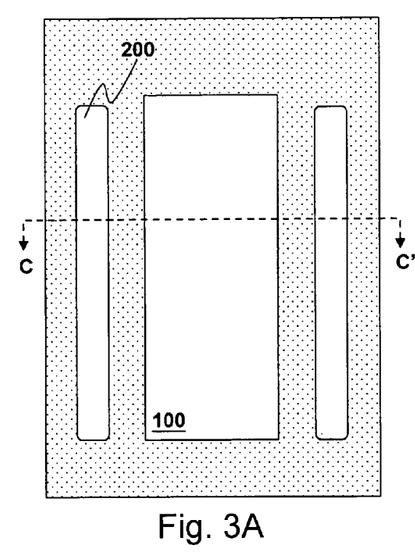
FIGS. 3A-3L show a first embodiment of the present invention.
Figure 3B:
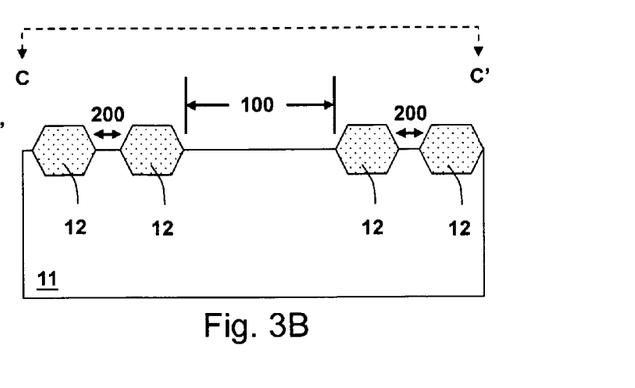

Please refer to FIGS. 3A-3L, which show a first embodiment of the present invention. FIGS. 3A-3L are schematic diagrams showing the manufacturing process of a lateral double diffused metal oxide semiconductor (LDMOS) device. FIG. 3B shows a cross-sectional view taken along CC' cross-section line shown in FIG. 3A. Referring to FIGS. 3A and 3B, a first conductive type substrate 11 is provided. The substrate 11 is for example but not limited to a P-type substrate. An isolation structure 12 is formed in the substrate 12 for defining a first device region 100 and a second device region 200. The isolation structure 12 for example includes LOCOS regions as shown in FIG. 3B, or STI (shallow trench isolation) regions.

Figure 3C:
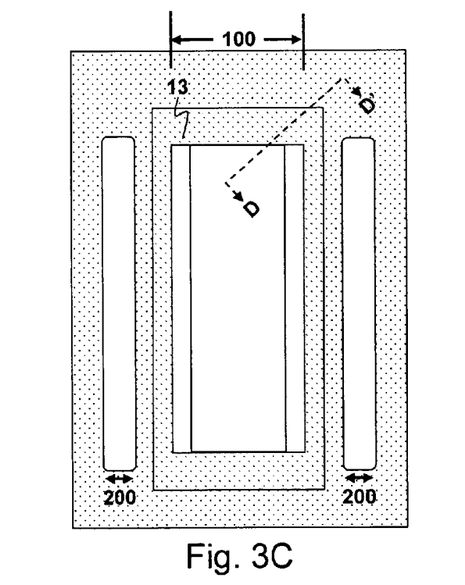
Figure 3D:
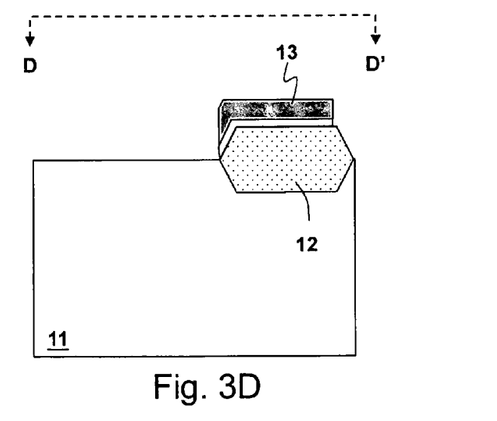

Next, as shown in FIGS. 3C and 3D, a gate 13 is formed on the substrate 11. The gate 13 has a ring-shaped structure from top view as shown in FIG. 3C. The ring-shaped structure is located along the boundary of the first area 100, and a part of the ring-shaped structure is located inside the first device region 100 from top view. Note that, both upper and lower sides of the ring-shaped structure of the gate 13 are completely located on the isolation structure 12 from top view shown in FIG. 3C. The aforementioned arrangement is for a reason that, referring to FIG. 3D which is a cross-sectional view taken along DD' cross-section line shown in FIG. 3C, when the LDMOS device operates, because corners of the ring-shaped structure are located on the isolation structure 12, the gate 13 will not partially turn ON, and there will be no significant leakage current at the corners of the gate 13.

Figure 3E:
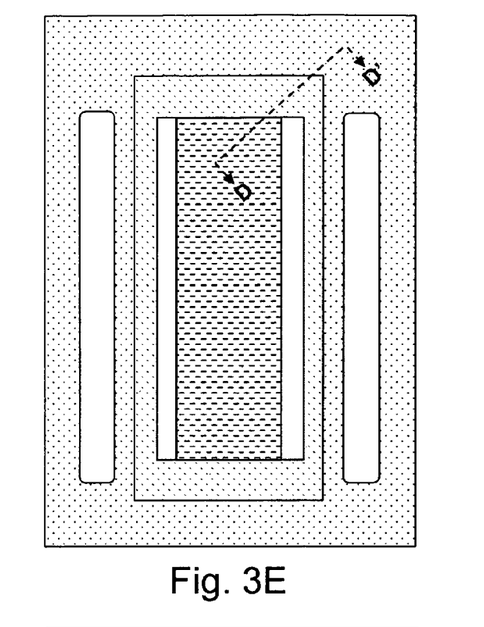
Figure 3F:
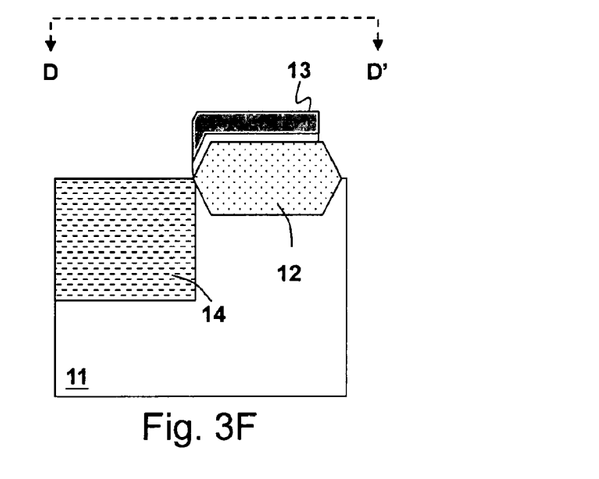

In the next, referring to FIGS. 3E and 3F, a body region 14 is formed in a region defined by lithography and masked by the gate 13, by implantation which implants first conductive type impurities, such as P-type impurities, in the form of accelerated ions to the defined region.

Figure 3G:
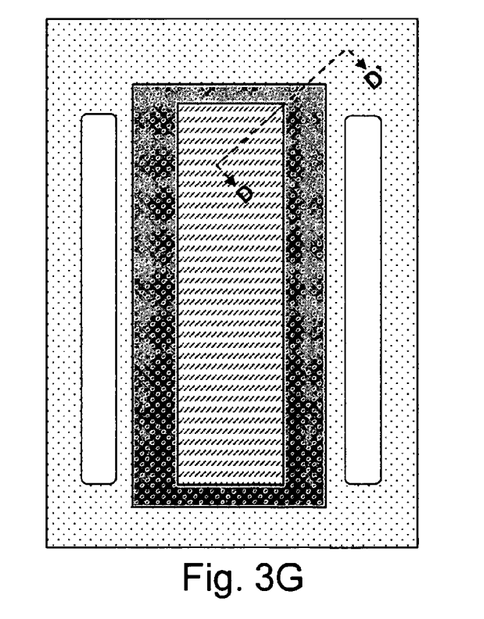
Figure 3H:
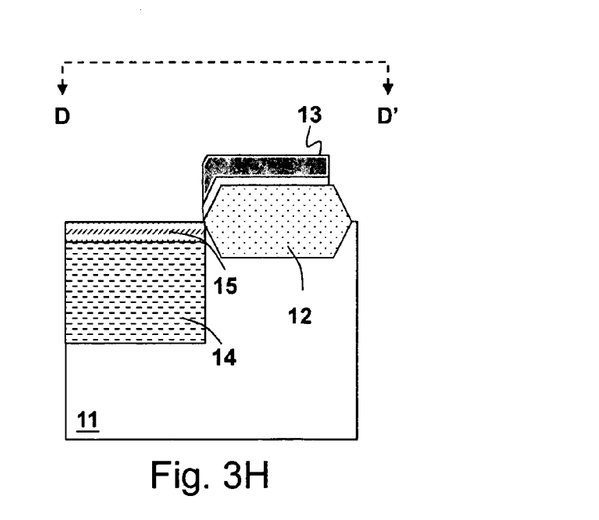

Further next, referring to FIGS. 3G and 3H, a lightly doped drain 15 is formed in a region defined by lithography and masked by the gate 13, by implantation which implants second conductive type impurities, such as N-type impurities, in the form of accelerated ions to the defined region.

Figure 3I:
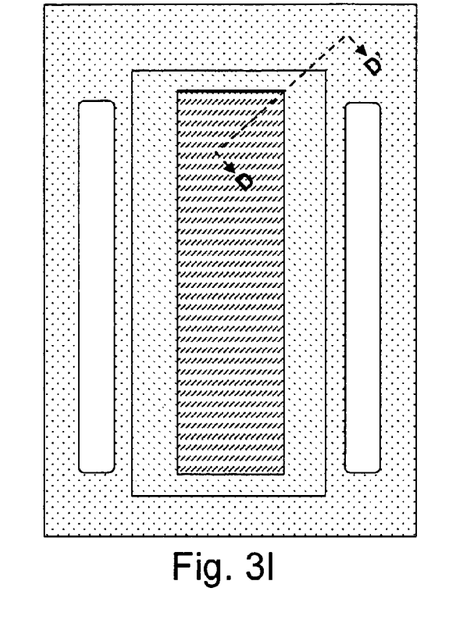
Figure 3J:
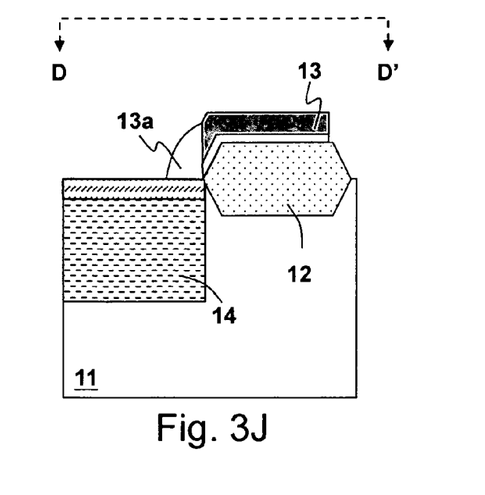
Figure 3K:
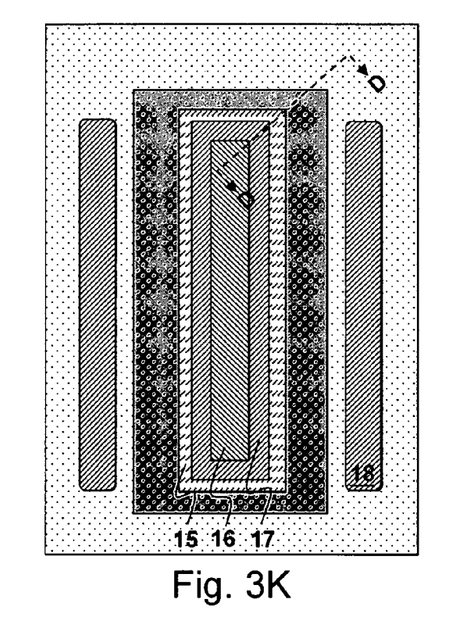
Figure 3L:
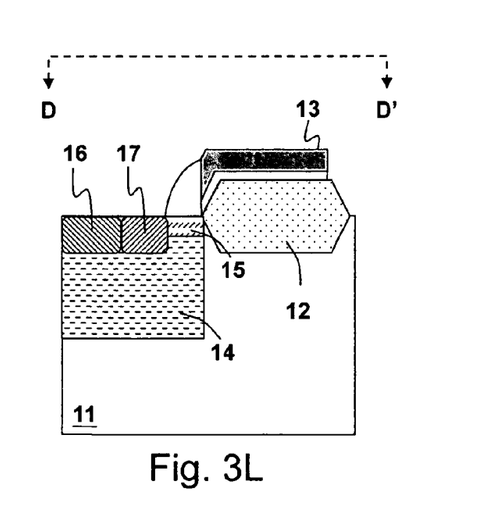

Next, referring to FIGS. 3I and 3J, spacers 13a are formed on the sidewalls of the gate 13 by deposition and self-alignment etch. Further next, referring to FIGS. 3K and 3L, a body electrode 16 is formed in a region defined by lithography and masked by the gate 13 and the spacers 13a, by implantation which implants first conductive type impurities, such as P-type impurities, in the form of accelerated ions to the defined region. Referring to FIGS. 3K and 3L, a source 17 and drains 18 are formed in regions defined by lithography and masked by the gate 13 and the spacers 13a, by implantation which implants second conductive type impurities, such as N-type impurities, in the form of accelerated ions to the defined regions. Note that, the lightly doped drain 15, the source 17, and the body electrode 16 are arranged from outside to inside within the ring-shaped structure from top view as shown in FIG. 3K, that is, the source 17 is interior of the lightly doped drain 15 and the body electrode 16 is further interior of the source 17, to form two LDMOS devices which share the common source 17.

Figure 4A:
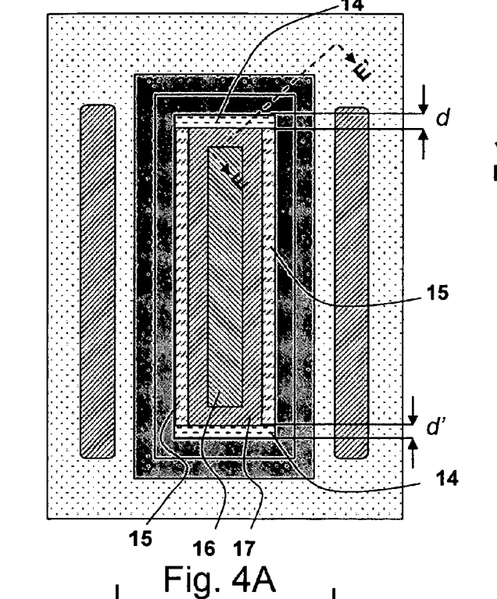
FIGS. 4A and 4B show a second embodiment of the present invention.
Figure 4B:
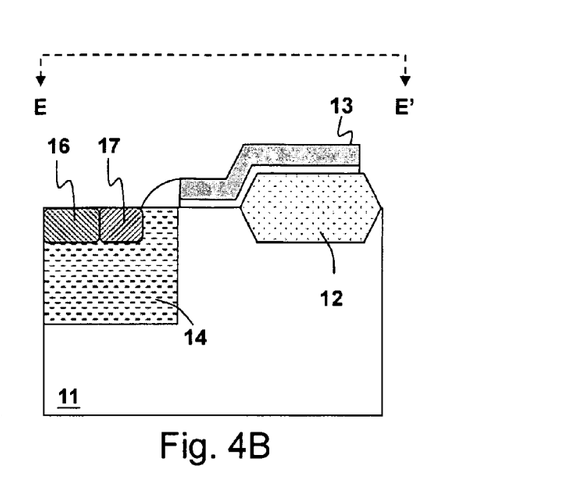

FIGS. 4A and 4B show a second embodiment of the present invention. In this embodiment, the upper and lower sides of the ring-shaped structure of the gate 13 are not completely located on the isolation structure 12 in the LDMOS device; furthermore, as shown in FIG. 4A, the lightly doped drain 15 is apart from the upper and lower sides of the ring-shaped structure by distances d and d' respectively (d and d' may be the same or different). The aforementioned arrangement is for the same reason as the first embodiment. Referring to FIG. 4B, which is a cross-sectional view taken along EE' cross-section line shown in FIG. 4A, when the LDMOS device operates, the gate 13 will not partially turn ON, and there will be no significant leakage current at the corners of the gate 13. In a preferred embodiment, the distances d and d' are not less than a design rule critical dimension, that is, the minimum width that can be defined by a lithography process in a manufacturing process for making the LDMOS device. A even preferred embodiment is that the distances d and d' are not less than 1 μm.

Figure 5A:
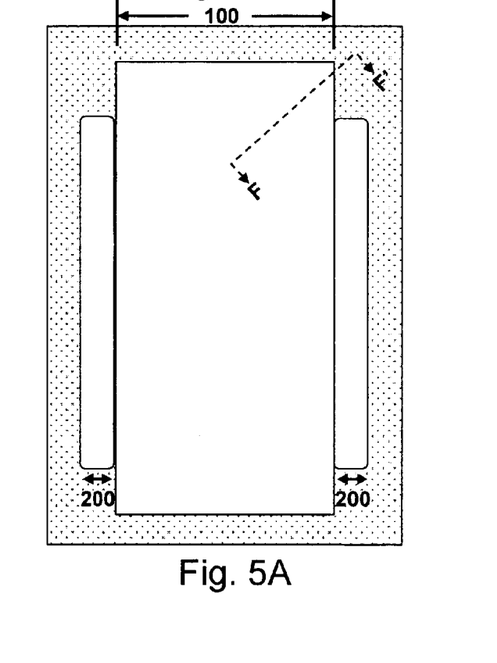
FIGS. 5A-5H show a third embodiment of the present invention.
Figure 5B:
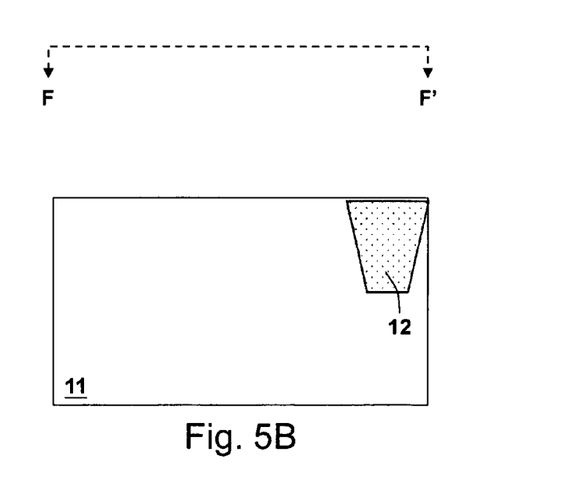

Referring to FIGS. 5A-5H, which show a third embodiment of the present invention. In this embodiment, the present invention is applied to another type of DMOS device, i.e., a double diffused drain metal oxide semiconductor (DDDMOS) device. FIGS. 5A-5H are schematic diagrams showing the manufacturing process of the DDDMOS device. FIG. 5B shows a cross-sectional view taken along FF' cross-section line shown in FIG. 5A. Referring to FIGS. 5A and 5B, a first conductive type substrate 11 is provided. The substrate 11 is for example but not limited to a P-type substrate. An isolation structure 12 is formed in the substrate 12 for defining a first device region 100 and a second device region 200. The isolation structure 12 for example includes STI regions as shown in FIG. 5B, or LOCOS regions.

Figure 5C:
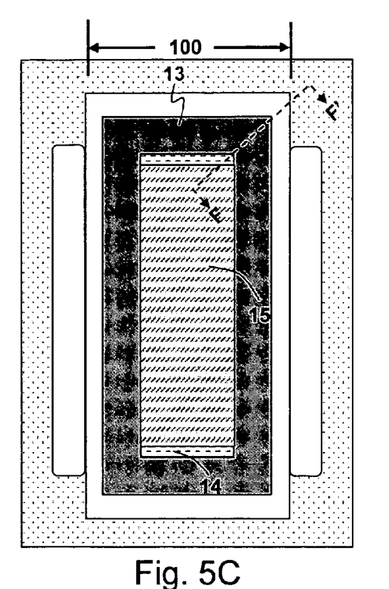
Figure 5D:
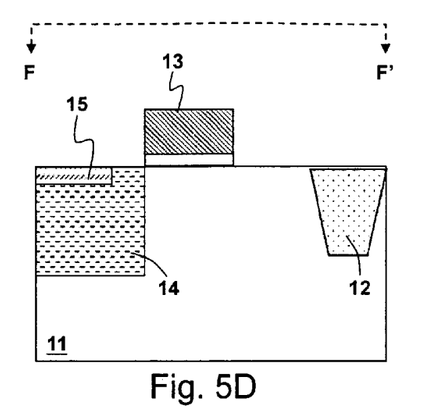

Next, as shown in FIGS. 5C and 5D, a gate 13 is formed on the substrate 11. The gate 13 has a ring-shaped structure from top view as shown in FIG. 5C. The ring-shaped structure is located along the boundary of the first device region 100; however, all of the ring-shaped structure is located inside the first device region 100 from top view. Further next, a body region 14 is formed in a region defined by lithography and masked by the gate 13, by implantation which implants first conductive type impurities, such as P-type impurities, in the form of accelerated ions to the defined region. Next, a lightly doped drain 15 is formed in a region defined by lithography and masked by the gate 13, by implantation which implants second conductive type impurities, such as N-type impurities, in the form of accelerated ions to the defined region. Note that, in this embodiment, the lightly doped drain 15 is apart from the upper and lower sides of the ring-shaped structure by at least a minimum distance. FIG. 5D is a cross-sectional view taken along FF' cross-section line shown in FIG. 5C. Similar to the aforementioned embodiments, when the DDDMOS device operates, the gate 13 will not partially turn ON, and there will be no significant leakage current at the corners of the gate 13. In a preferred embodiment, the minimum distance is not less than a design rule critical dimension, that is, the minimum width that can be defined by a lithography process in a manufacturing process for making the LDMOS device. A even preferred embodiment is that the minimum distance is not less than 1 μm.

Figure 5E:
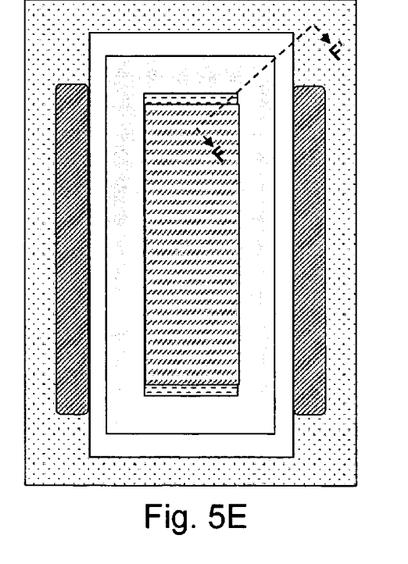
Figure 5F:
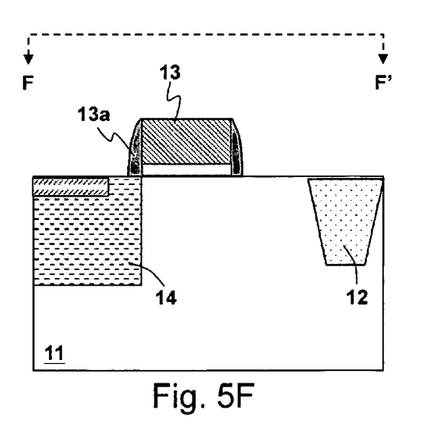
Figure 5G:
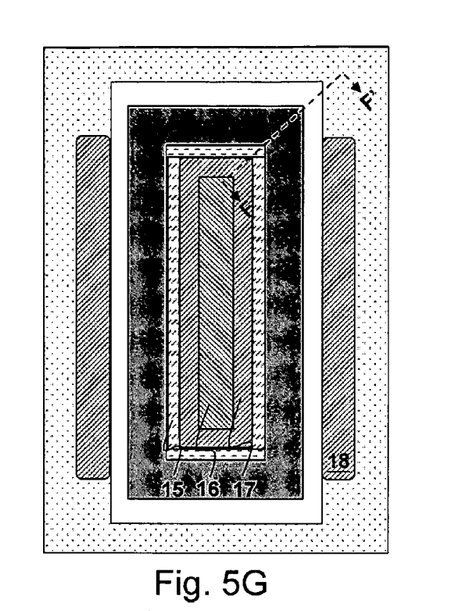
Figure 5H:
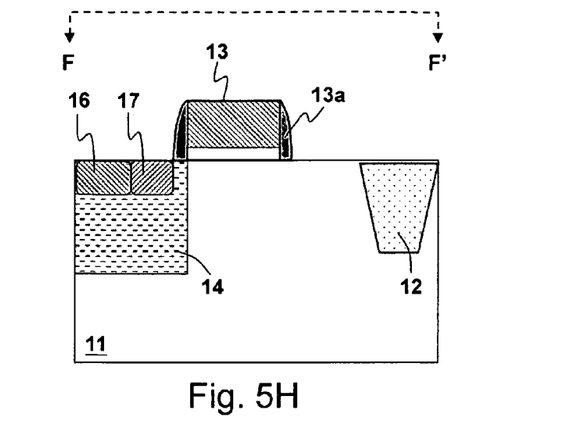

Next, referring to FIGS. 5E and 5F, spacers 13a are formed on the sidewalls of the gate 13 by deposition and self-alignment etch. Further next, referring to FIGS. 5G and 5H, a body electrode 16 is formed in a region defined by lithography and masked by the gate 13 and the spacers 13a, by implantation which implants first conductive type impurities, such as P-type impurities, in the form of accelerated ions to the defined region. Referring to FIGS. 5G and 5H, a source 17 and drains 18 are formed in regions defined by lithography and masked by the gate 13 and the spacers 13a, by implantation which implants second conductive type impurities, such as N-type impurities, in the form of accelerated ions to the defined regions. Note that, the lightly doped drain 15, the source 17, and the body electrode 16 are arranged from outside to inside within the ring-shaped structure from top view as shown in FIG. 5G, that is, the source 17 is interior of the lightly doped drain 15 and the body electrode 16 is further interior of the source 17, to form two DDDMOS devices which share the common source 17.

Figure 6A:
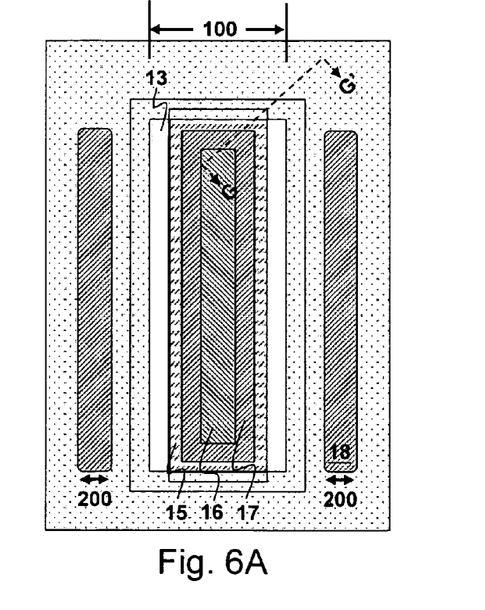
FIGS. 6A and 6B show a fourth embodiment of the present invention.
Figure 6B:
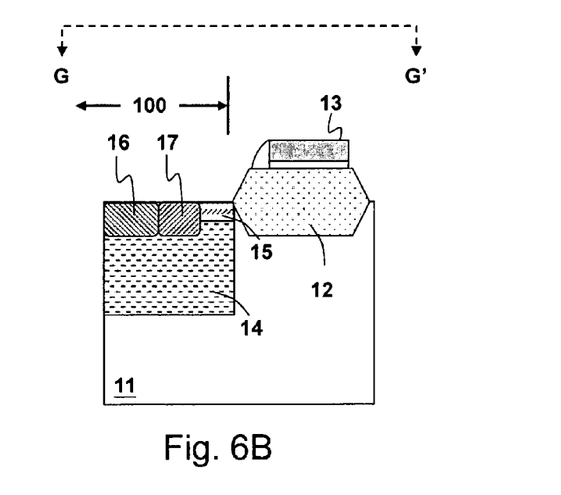

FIGS. 6A and 6B show a fourth embodiment of the present invention. This embodiment shows that the upper and lower sides of the ring-shaped structure of the gate 13 in the LDMOS device are not only completely on the isolation structure 12, but further apart from the edge of the isolation structure 12 with a larger distance than the first embodiment. That is, the corners of the ring-shaped structure do not have to connect to the body region 14, as seen from top view as shown in FIG. 6A and from cross-section view as shown in FIG. 6B, wherein FIG. 6B is a cross-sectional view taken along GG' cross-section line shown in FIG. 6A. The key point is that the edge of the channel is arranged so that, when the LDMOS device operates, the gate 13 will not partially turn ON, and there will be no significant leakage current at the corners of the gate 13. As long as the above purpose is achieved, the gate 13 can be designed in various shapes and is not limited to the rectangular shape as shown in the aforementioned embodiments.

Figure 7A:
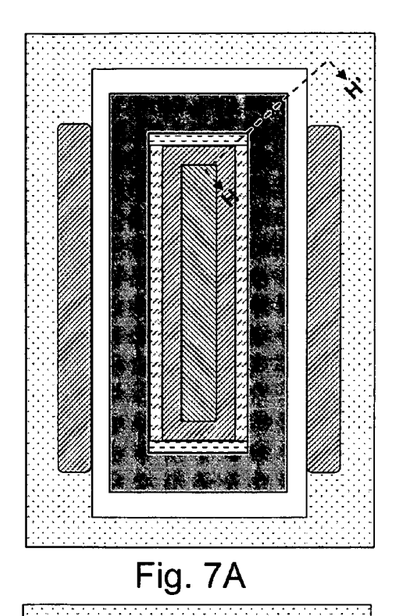
FIGS. 7A and 7B show a fifth embodiment of the present invention.
Figure 7B:
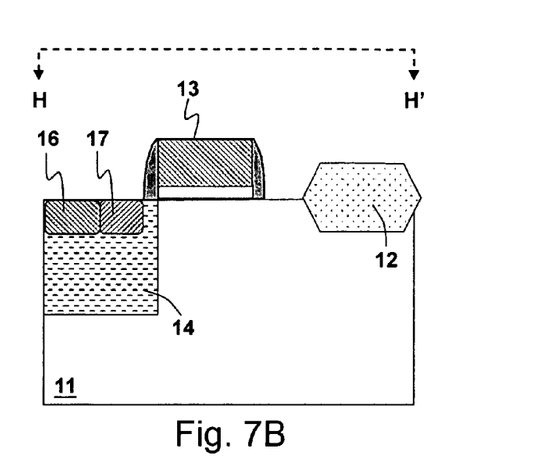

FIGS. 7A and 7B show a fifth embodiment of the present invention. This embodiment shows that the isolation structure 12 is formed by LOCOS. FIG. 7B is a cross-sectional view taken along HH' cross-section line shown in FIG. 7A. Similar to the aforementioned embodiments, when the DDDMOS device operates, the gate 13 will not partially turn ON, and there will be no significant leakage current at the corners of the gate 13.

Figure 8A:
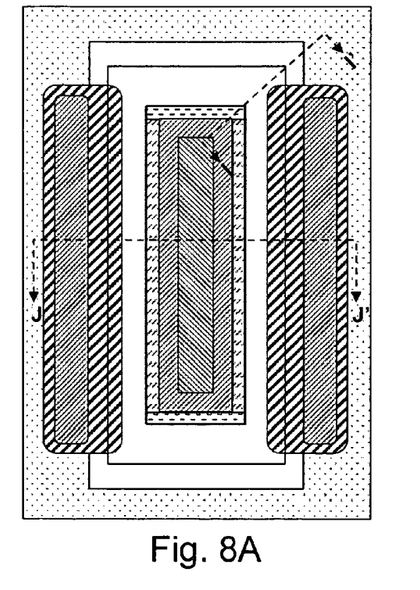
FIGS. 8A-8C show a sixth embodiment of the present invention.
Figure 8B:
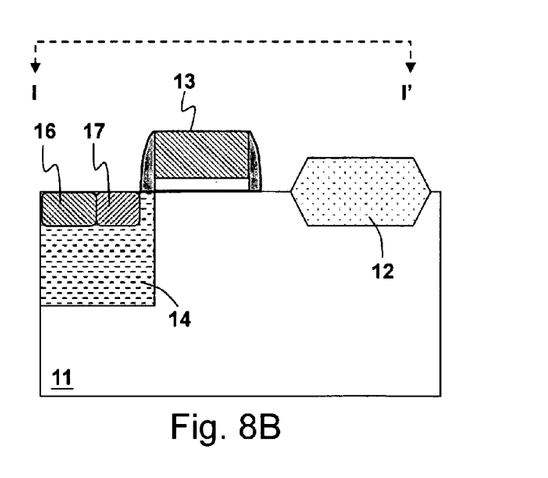
Figure 8C:
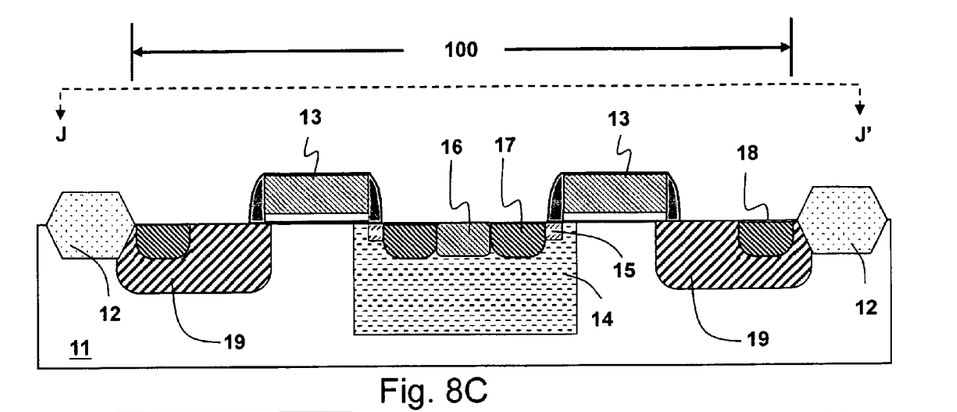

FIGS. 8A-8C show a sixth embodiment of the present invention. This embodiment is different from the third embodiment in that, the DDDMOS device in this embodiment further includes drain extended regions (drift regions) 19. FIGS. 8B and 8C are cross-sectional views taken along II' and JJ' cross-section lines shown in FIG. 8A, respectively. This embodiment shows that, the DDDMOS device may further include the drain extended regions 19 as part of the channel.

Figure 9A:
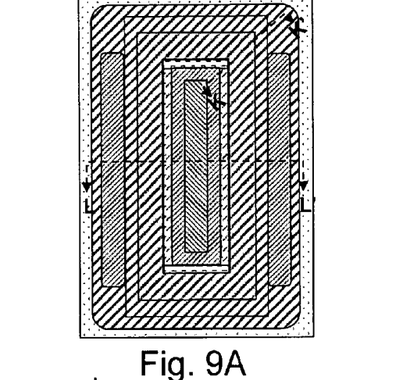
FIGS. 9A-9C show a seventh embodiment of the present invention.
Figure 9B:
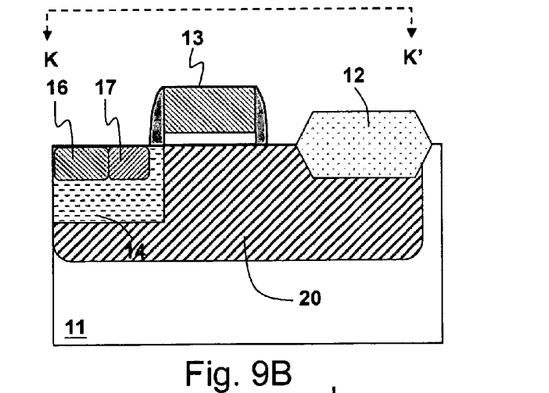
Figure 9C:
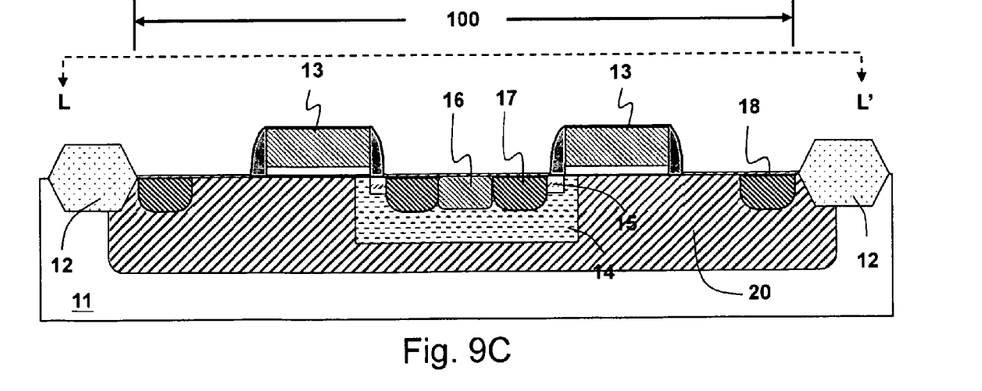

FIGS. 9A-9C show a seventh embodiment of the present invention. This embodiment is different from the sixth embodiment in that, the DMOS device in this embodiment does not include the drain extended region 19; instead, this embodiment includes a well 20, which is formed by blanket implantation which implants second conductive type impurities, such as N-type impurities, in the form of accelerated ions to the substrate. FIGS. 9B and 9C are cross-sectional views taken along KK' and LL' cross-section lines shown in FIG.

9A, respectively. This embodiment shows that, the DMOS device may further include the well 20 as part of the channel.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above is not limited to photolithography by a photo mask; it can be electron beam lithography, X-ray lithography, etc. For another example, the present invention may be also applied to two DMOS devices with a common drain, as long as proper consideration is taken such as the locations of the body region, the body electrode, and the lightly doped drain, etc. For another example, the present invention also may be applied to other devices which include a ring-shaped gate, not necessarily a DMOS device. In view of the foregoing, the spirit of the present invention should cover all such and other modifications and variations, which should be interpreted to fall within the scope of the following claims and their equivalents.

What is claimed is:

1. A method of manufacturing a double diffused metal oxide semiconductor (DMOS) device, comprising:

providing a substrate in which an isolation structure is formed for defining a first device region and a second device region;

forming a gate on the substrate, the gate having a ring-shaped structure located along a boundary of the first device region, wherein the ring-shaped structure is completely or partially inside the first device region from top view;

forming a body region in the first device region in an area defined by the ring-shaped structure, the body region being doped with first conductive type impurities;

forming a lightly doped drain in the body region, the lightly doped drain being doped with second conductive type impurities;

forming a source in the body region, interior of the lightly doped drain, the source being doped with the second conductive type impurities;

forming a body electrode in the body region, interior of the source, the body electrode being doped with the first conductive type impurities; and forming a drain in the second device region;

wherein corners of the ring-shaped structure are located completely on the isolation structure.

2. The method of claim 1, wherein the ring-shaped structure is substantially rectangular and both the shorter sides of the ring-shaped structure are located completely on the isolation structure.

3. The method of claim 1, wherein the DMOS device includes two lateral double diffused metal oxide semiconductor (LDMOS) devices with a common source, or two double diffused drain metal oxide semiconductor (DDDMOS) devices with a common source.

* * * * *